United States Patent
Nakashima et al.

(10) Patent No.: US 8,121,163 B2
(45) Date of Patent: Feb. 21, 2012

(54) SEMICONDUCTOR LASER DIODE APPARATUS AND METHOD OF FABRICATING THE SAME

(75) Inventors: Saburo Nakashima, Yawata (JP); Yasuhiko Nomura, Osaka (JP); Masayuki Hata, Kadoma (JP); Takenori Goto, Moriguchi (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 12/047,924

(22) Filed: Mar. 13, 2008

(65) Prior Publication Data

US 2008/0225920 A1 Sep. 18, 2008

(30) Foreign Application Priority Data

Mar. 16, 2007 (JP) .................................. 2007-067830
Mar. 10, 2008 (JP) .................................. 2008-058990

(51) Int. Cl.
*H01S 3/04* (2006.01)
*H01S 5/00* (2006.01)

(52) U.S. Cl. .................................. 372/44.01; 372/43.01

(58) Field of Classification Search ............... 372/44.01, 372/43.01
See application file for complete search history.

(56) References Cited

U.S. PATENT DOCUMENTS

| | | | |
|---|---|---|---|
| 2003/0165169 A1 | 9/2003 | Nomoto et al. | |
| 2005/0003572 A1* | 1/2005 | Hahn et al. | 438/47 |
| 2007/0064758 A1* | 3/2007 | Kuramoto et al. | 372/43.01 |

FOREIGN PATENT DOCUMENTS

| | | |
|---|---|---|
| JP | 5833885 A | 2/1983 |
| JP | 2001015861 A | 1/2001 |
| JP | 2001-274501 A | 10/2001 |
| JP | 2001274501 A * | 10/2001 |
| JP | 2003-31895 A | 1/2003 |
| JP | 2003017793 A | 1/2003 |
| JP | 200337323 A | 2/2003 |
| JP | 2003-158328 A | 5/2003 |
| JP | 2003174114 A | 6/2003 |
| JP | 2003258370 A | 9/2003 |
| JP | 2005072052 A | 3/2005 |
| JP | 2006-41085 A | 2/2006 |
| JP | 200781283 A | 3/2007 |
| JP | 2007053243 A | 3/2007 |
| JP | 2007103542 A | 4/2007 |

OTHER PUBLICATIONS

Japanese Office Action, 2008-058990, Nov. 11, 2008, 6 P, Japan Patent Office, Japan.

* cited by examiner

*Primary Examiner* — Patrick Stafford
(74) *Attorney, Agent, or Firm* — Ditthavong Mori & Steiner, P.C.

(57) ABSTRACT

A semiconductor laser diode apparatus capable of suppressing variation in an emission position and an emission direction of a laser beam emitted from a semiconductor laser diode element is obtained. This semiconductor laser diode apparatus includes a semiconductor laser diode element having warping along either a first direction in which a cavity extends or a second direction intersecting with the first direction and a base on which a convex side of the warping of the semiconductor laser diode element is fixed, wherein a distance between a first end of the semiconductor laser diode element in a direction of larger warping among the first and second directions and the base is smaller than a distance between a second end of the semiconductor laser diode element in the direction of the large warping among the first and second directions and the base.

12 Claims, 7 Drawing Sheets

SEMICONDUCTOR LASER DIODE APPARATUS AND METHOD OF FABRICATING THE SAME

CROSS-REFERENCE TO RELATED APPLICATIONS

The priority application numbers JP2007-67830, Semiconductor Laser Diode Apparatus and Method of Fabricating the Same, Mar. 16, 2007, Saburo Nakashima et al. and JP2008-58990, Semiconductor Laser Diode Apparatus and Method of Fabricating the Same, Mar. 10, 2008, Saburo Nakashima et al., upon which this patent application is based are hereby incorporated by reference.

BACKGROUND OF THE INVENTION

1. Field of the Invention

The present invention relates to a semiconductor laser diode apparatus and a method of fabricating the same, and more particularly, it relates to a semiconductor laser diode apparatus comprising a semiconductor laser diode element fixed on a base and a method of fabricating the same.

2. Description of the Background Art

A semiconductor laser diode apparatus comprising a semiconductor laser diode element fixed on a base or the like is known in general, as disclosed in Japanese Patent Laying-Open Nos. 2006-41085 and 2003-31895, for example.

The aforementioned Japanese Patent Laying-Open No. 2006-41085 discloses a semiconductor laser diode apparatus comprising a semiconductor laser chip (semiconductor laser diode element) and a submount (base) on which the semiconductor laser chip is fixed. In the semiconductor laser diode apparatus, the semiconductor laser chip is constituted by a substrate and a semiconductor layer formed on the substrate.

The aforementioned Japanese Patent Laying-Open No. 2003-31895 discloses a semiconductor light-emitting apparatus comprising a semiconductor light-emitting device chip (semiconductor laser diode element) having warping and a mount member (base) on which the semiconductor light-emitting device chip is fixed and a method of fabricating the same. The mount member with a surface formed in a shape corresponding to the shape of the warping of the semiconductor light-emitting device chip is employed in this semiconductor light-emitting apparatus. Thus, the semiconductor light-emitting device chip is fixed on the mount member in a state of warping in a prescribed direction.

In the conventional semiconductor laser diode apparatus disclosed in Japanese Patent Laying-Open No. 2006-41085, however, the semiconductor laser chip is constituted by the substrate and the semiconductor layer formed on the substrate, and hence warping disadvantageously possibly occurs on the semiconductor laser chip due to difference in thermal expansion coefficient between the substrate and the semiconductor layer and difference in lattice constant between the substrate and the semiconductor layer. In this cases the semiconductor laser chip generally has an elongated shape along a direction in which a cavity extends, and hence the amount of warping is increased along the direction in which the cavity of the semiconductor laser chip extends. Therefore, the warping amount along the direction in which the cavity of the semiconductor laser chip extends is likely to vary, and hence the distance between the semiconductor laser chip on the light-emitting end of the cavity of the semiconductor laser chip and the submount is likely to vary in a case where the convex side of the warping of the semiconductor laser chip is fixed on the submount. Thus, an emission position of a laser beam emitted from the light-emitting end of the cavity of the semiconductor laser chip is disadvantageously likely to vary. In the case where the convex side of the warping of the semiconductor laser chip is fixed on the submount, the semiconductor laser chip is generally arranged on the submount in a state where the emission direction of the laser beam emitted from the semiconductor laser chip is inclined upward with respect to a surface of the submount and hence the emission direction of the laser beam emitted from the semiconductor laser chip (semiconductor laser diode element) disadvantageously varies due to variation in the warping amount along the direction in which the cavity of the semiconductor laser chip extends In the conventional semiconductor light-emitting apparatus and method of fabricating the same disclosed in Japanese Patent Laying-Open No 2003-31895, the semiconductor light-emitting device chip is fixed on the mount member formed in a curved surface shape or a prescribed shape (concave shape) corresponding to the shape of the warping of the semiconductor light-emitting device chip, and hence variation in the warping shape (warping amount) of the semiconductor light-emitting device chip and the shape of the mount member may not be conceivably properly correspond to each other. In this case, the distance between the semiconductor light-emitting device chip and the mount member on the light-emitting end of the cavity is likely to vary. Therefore, the emission position of the laser beam emitted from the light-emitting end of the cavity of the semiconductor light-emitting device chip is disadvantageously likely to vary.

SUMMARY OF THE INVENTION

A semiconductor laser diode apparatus according to a first aspect of the present invention comprises a semiconductor laser diode element having warping along at least either a first direction in which a cavity extends or a second direction intersecting with the first direction, and a base on which a convex side of the warping of the semiconductor laser diode element is fixed, wherein a distance between a first end of the semiconductor laser diode element in a direction of larger warping among the first and second directions and the base is smaller than a distance between a second end of the semiconductor laser diode element in the direction of the larger warping among the first and second directions and the base.

A method of fabricating a semiconductor laser diode apparatus according to a second aspect of the present invention comprises steps of forming a semiconductor laser diode element having warping along at least either a first direction in which a cavity extends or a second direction intersecting with the first direction, and fixing a convex side of the warping of the semiconductor laser diode element on a base such that a distance between a first end of the semiconductor laser diode element in a direction of larger warping among the first and second directions and the base is smaller than a distance between a second end of the semiconductor laser diode element in the direction of the larger warping among the first and second directions and the base.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be hereinafter described with reference to the drawings.

A schematic structure of a semiconductor laser diode apparatus 1 of the present invention will be described with reference to FIG. 1 before describing specific embodiments of the present invention.

Figure 1:
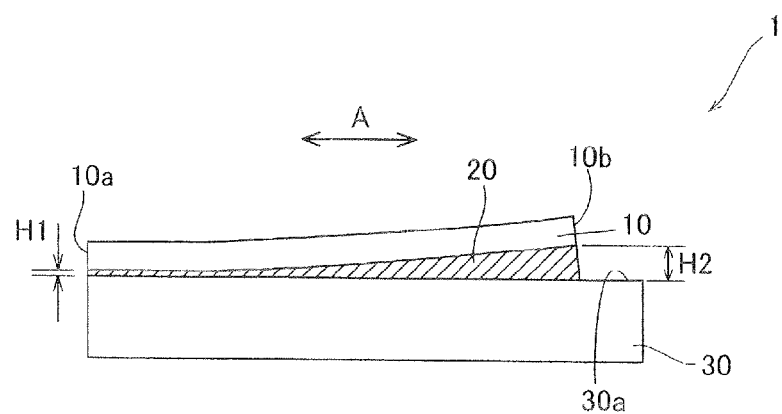
FIG. 1 is a sectional view for schematically illustrating a structure of a semiconductor laser diode apparatus of the present invention.

In the semiconductor laser diode apparatus 1 of the present invention, a semiconductor laser diode element 10 is fixed on a base 30 through a conductive adhesive layer 20 made of a metal layer, as shown in FIG. 1 The conductive adhesive layer 20 is an example of the "fusion layer" in the present invention.

The semiconductor laser diode element 10 has warping along a direction A. The semiconductor laser diode element 10 has a convex side of the warping fixed on an upper surface 30a of the base 30. In addition, a distance (thickness of the conductive adhesive layer 20) H1 between the semiconductor laser diode element 10 and the base 30 in the vicinity of a first end 10a of the semiconductor laser diode element 10 is smaller than a distance (thickness of the conductive adhesive layer 20) H2 between the semiconductor laser diode element 10 and the base 30 in the vicinity of a second end 10b of the semiconductor laser diode element 10.

The semiconductor laser diode element 10 may further have warping smaller than the warping in the direction A, along a direction intersecting with the direction A. In this case, H1 is defined as the minimum value of the distance between the semiconductor laser diode element 10 and the base 30 in the vicinity of the first end 10a while H2 is defined as the minimum value of the distance between the semiconductor laser diode element 10 and the base 30 in the vicinity of the second end 10b. FIG. 1 more specifically shows the semiconductor laser diode element 10 in which an extending direction of a cavity is the direction A, a light-emitting surface of the cavity is the first end 10a and a light reflective surface of the cavity is the second end 10b.

The semiconductor laser diode element 10 can be constituted by forming a semiconductor layer on a substrate such as a gallium nitride substrate, a sapphire substrate, a silicon substrate and a silicon carbide substrate.

Dielectric multilayer films may be formed on the first end 10a and the second end 10b of the semiconductor laser diode element 10.

In the semiconductor laser diode apparatus 1 of the present invention, as hereinabove described, the distance H1 between the first end 10a of the semiconductor laser diode element 10 and the base 30 in the direction A of larger warping is smaller than the distance H2 between the second end 10b of the semiconductor laser diode element 10 and the base 30 in the direction A, whereby variation in the distance between the semiconductor laser diode element 10 and the base 30 in the first end 10a of the semiconductor laser diode element 10 can be reduced as compared with a case where the distance between the semiconductor laser diode element 10 and the base 30 in the first end 10a of the semiconductor laser diode element 10 is larger. Thus, in a case where the first end 10a of the semiconductor laser diode element 10 is so formed as to be the light-emitting end of the cavity, for example, variation in the emission direction of the laser beam emitted from the light-emitting end can be suppressed. The convex side of the warping of the semiconductor laser diode element 10 is fixed on the base 30 and the distance H1 between the semiconductor laser diode element 10 and the base 30 in the first end 10a of the semiconductor laser diode element 10 in the direction A is smaller than the distance H2 between the semiconductor laser diode element 10 and the base 30 in the second end 10b of the semiconductor laser diode element 10 in the direction A, whereby the first end 10a of the semiconductor laser diode element 10 can be so arranged as to be substantially parallel to the surface of the base 30. Thus, in a case where the first end 10a of the semiconductor laser diode element 10 is so formed as to be the light-emitting end of the cavity, for example, the semiconductor laser diode element 10 can be inhibited from being arranged in a state where the emission direction of the laser beam emitted from the light-emitting end is inclined upward with respect to the surface of the base 30. As a result, variation in the emission direction of the laser beam emitted from the light-emitting end of the cavity of the semiconductor laser diode element 10 can be suppressed. The semiconductor laser diode element 10 having the warping along the direction A is fixed on the base 30, whereby increase in stress inside the semiconductor laser diode element 10 can be suppressed dissimilarly to a case where the semiconductor laser diode element 10 with no warping due to application of external force or the like is fixed on the base 30 and hence deterioration of laser characteristics and breakage of the semiconductor laser diode element 10 can be suppressed.

According to the present invention, the light-emitting end is distinguished by magnitude relation between the intensities of laser beams emitted from cavity facets on a light emission side and on a light reflective side respectively. In other words, a side on which the emission intensity of the laser beam is relatively large is the light-emitting end and a side on which the emission intensity of the laser beam is relatively small is the light reflective end.

First Embodiment

A structure of a semiconductor laser diode apparatus according to a first embodiment and a structure of a semiconductor laser comprising the same will be now described with reference to FIGS. 2 to 5.

Figure 2:
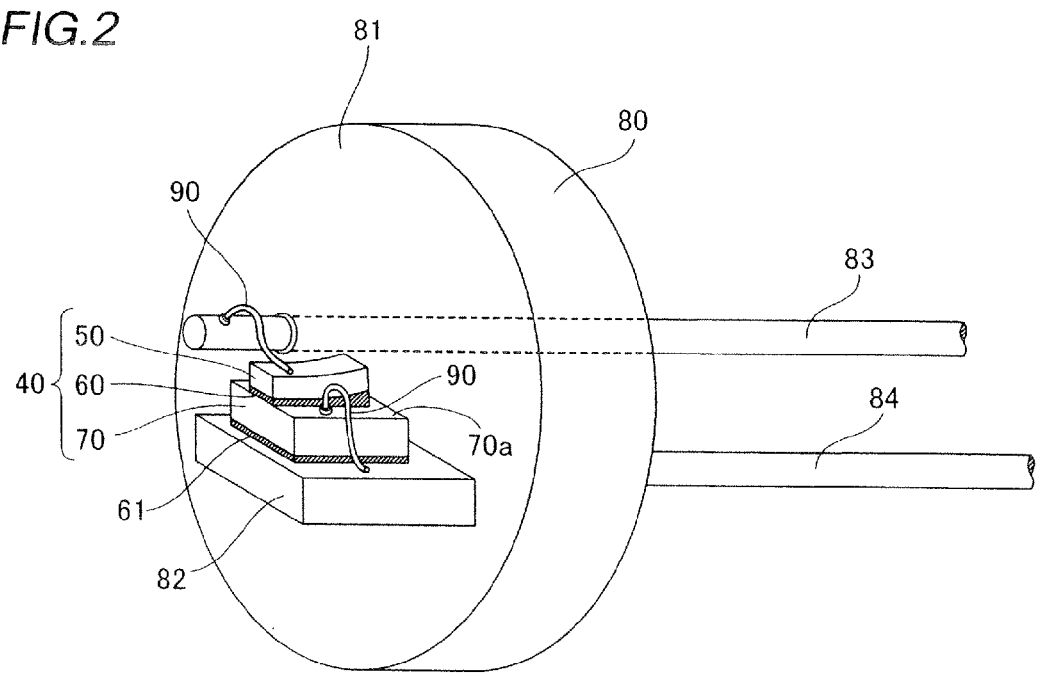
FIG. 2 is a perspective view for illustrating a structure of a semiconductor laser comprising a semiconductor laser diode apparatus according to a first embodiment of the present invention.
Figure 3:
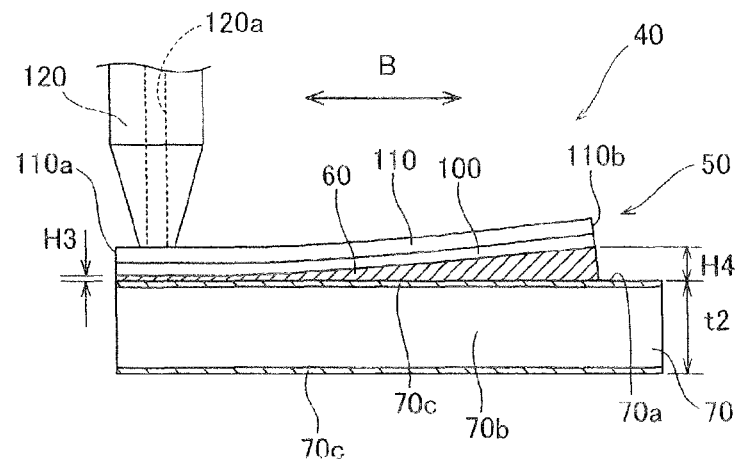
FIG. 3 is a sectional view for illustrating a structure of the semiconductor laser diode apparatus according to the first embodiment of the present invention.

In the semiconductor laser comprising a semiconductor laser diode apparatus 40 according to the first embodiment, a semiconductor laser diode element 50 is fixed on a base 70 through a conductive adhesive layer 60 of AuSn as shown in FIGS. 2 and 3. The conductive adhesive layer 60 is an example of the "fusion layer" in the present invention. The base 70 is fixed on a pedestal portion 82 provided in a body portion 81 of a stem 80 made of a metal through a conductive adhesive layer 61 of AuSn as shown in FIG. 2. This stem 80 is provided with two lead terminals 83 and 84.

The lead terminal 83 of the stem 80 is wire-bonded onto an upper surface of the semiconductor laser diode element 50 with an Au wire 90 The pedestal portion 82 of the stem 80 is wire-bonded onto an upper surface 70a of the base 70 with the Au wire 90. The body portion 81 of the stem 80 is mounted with a cap (not shown) with a window through which the laser beam is transmitted.

Figure 4:
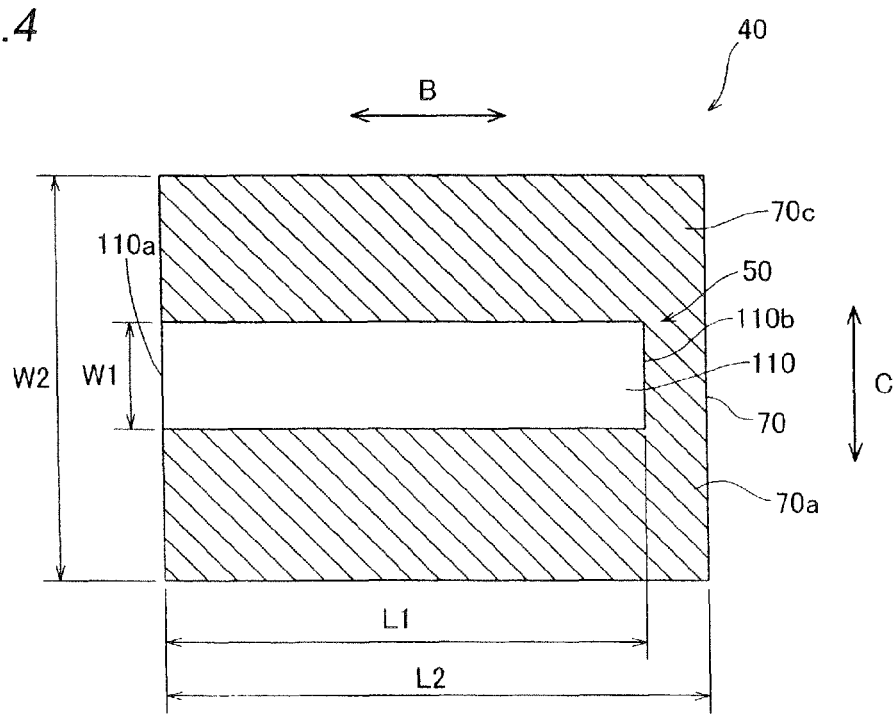
FIG. 4 is a plan view for illustrating the structure of the semiconductor laser diode apparatus according to the first embodiment of the present invention.
Figure 5:
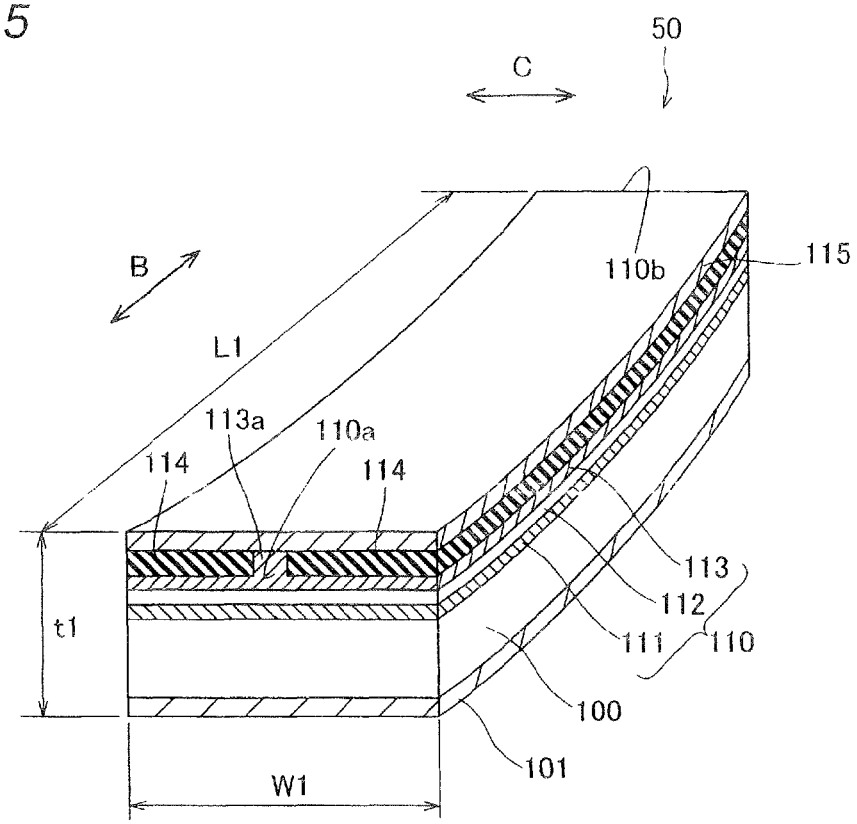
FIG. 5 is a perspective view for illustrating a structure of a semiconductor laser diode element of the semiconductor laser diode apparatus according to the first embodiment of the present invention shown in FIG. 3.

The semiconductor laser diode element 50 has a width (W1) of about 200 μm, a length (L1) of about 1000 μm and a thickness (t1) of about 100 μm (see FIG. 5) as shown in FIGS. 4 and 5.

According to the first embodiment, the semiconductor laser diode element 50 includes a substrate 100 arranged on a side closer to the base 70 and a semiconductor laser diode portion 110 arranged on a side farther from the base 70, as shown in FIG. 3. The substrate 100 is an example of the "substrate" in the present invention.

More specifically, an n-type AlGaN cladding layer 111, an active layer 112 made of GaInN and a p-type AlGaN cladding layer 113 are formed on an upper surface of a substrate 100 made of gallium nitride, silicon and silicon carbide, as shown in FIG. 5. These n-type AlGaN cladding layer 111, active layer 112 and p-type AlGaN cladding layer 113 form the semiconductor laser diode portion 110. The n-type AlGaN cladding layer 111 the active layer 112 and the p-type AlGaN cladding layer 113 are each an example of the "nitride-based semiconductor layer" in the present invention. In the p-type AlGaN cladding layer 113, a waveguide structure is formed by forming a ridge portion 113a extending in a direction B. As shown in FIG. 3, a light-emitting surface (cavity facet) 110a and a light reflective surface (cavity facet) 110b are formed on ends in the direction B of the semiconductor laser diode portion 110. The light-emitting surface 110a is an example of the "first end" or the "light-emitting end" in the present invention, and the light reflective surface 110b is an example of the "second end" or the "light reflective end" in the present invention. The light-emitting surface 110a, the light reflective surface 110b and the waveguide structure constitute the cavity extending in the direction B. Dielectric multilayer films (not shown) are formed on the light-emitting surface 110a and the light reflective surface 110b. As shown in FIG. 5, an insulating film 114 made of $SiO_2$ is formed on an upper surface of the p-type AlGaN cladding layer 113 except the ridge portion 113a.

An n-side electrode 101 in which an Al layer, a Pd layer and an Au layer are stacked in this order from one nearest to the substrate 100 is formed on a lower surface of the substrate 100. According to the first embodiment, a lower surface of the n-side electrode 101 is a bonding surface. A p-side electrode 115 in which a Pt layer, a Pd layer, a Ti layer, a Pd layer and an Au layer are stacked in this order from one nearest to the ridge portion 113a and the insulating film 114 is formed on upper surfaces of the ridge portion 113a of the p-type AlGaN cladding layer 113 and the insulating film 114.

According to the first embodiment, the semiconductor laser diode element 50 has warping of about 0.5 μm to about 3 μm along in the direction in which the cavity extends (direction B) as shown in FIGS. 3 and 5, although it varies with the kinds or quantities of addition elements of heterojunction. In the semiconductor laser diode portion 110, a surface on a side farther from the substrate 100 is concave, and the semiconductor laser diode element 50 has the convex side (substrate 100 side) of the warping fixed on the base 70 (see FIG. 3). The warping of the semiconductor laser diode element 50 occurs due to difference in thermal expansion coefficient between the substrate 100 and the semiconductor laser diode portion 110 and difference in lattice constant between the substrate 100 and the semiconductor laser diode portion 110.

More specifically, gallium nitride has a thermal expansion coefficient in the a-axis direction of about $5.59 \times 10^{-6}$/K and a lattice constant in the a-axis direction of about $3.189 \times 10^{-10}$ m, as shown in the following Table 1. Silicon has a thermal expansion coefficient in the a-axis direction of about $2.6 \times 10^{-6}$/K and a lattice constant in the a-axis direction of about $5.43 \times 10^{-10}$ m. Silicon carbide has a thermal expansion coefficient in the a-axis direction of about $4.2 \times 10^{-6}$/K and a lattice constant in the a-axis direction of about $3.081 \times 10^{-10}$ m. AlGaN has a thermal expansion coefficient in the a-axis direction of about $4.15 \times 10^{-6}$/K to about $5.59 \times 10^{-6}$/K and a lattice constant in the a-axis direction of about $3.112 \times 10^{-10}$ m to about $3.189 \times 10^{-10}$ m. GaInN has a thermal expansion coefficient in the a-axis direction of about $3.8 \times 10^{-6}$/K to about $5.59 \times 10^{-6}$/K and a lattice constant in the a-axis direction of about $3.189 \times 10^{-10}$ m to about $3.533 \times 10^{-10}$ m.

TABLE 1

| Material | Thermal Expansion Coefficient ($10^{-6}$/K) in a-Axis Direction | Lattice Constant ($10^{-10}$ m) in a-Axis Direction | Warping of Element Forming Surface |
|---|---|---|---|
| GaN (Gallium Nitride Substrate) | 5.59 | 3.189 | Concave |
| Si (Silicon Substrate) | 2.6 | 5.43 | Concave |
| SiC (6H) (Silicon Carbide Substrate) | 4.2 | 3.081 | Concave |

TABLE 1-continued

| Material | Thermal Expansion Coefficient ($10^{-6}$/K) in a-Axis Direction | Lattice Constant ($10^{-10}$ m) in a-Axis Direction | Warping of Element Forming Surface |
|---|---|---|---|
| AlGaN (Main Material of Element Portion of This Application) | 4.15~5.59 | 3.112~3.189 | |
| GaInN (Active Layer of This Application) | 3.8~5.59 | 3.189~3.533 | |

In a case where the substrate 100 is made of gallium nitride, warping occurs in the direction B such that the substrate 100 side of the semiconductor laser diode element 50 is convex (semiconductor laser diode portion 110 side is concave) resulting from the lattice constants of the n-type AlGaN cladding layer 111 and the p-type AlGaN cladding layer 113 constituting the semiconductor laser diode portion 110 smaller than that of the substrate 100. The active layer 112 has a lattice constant larger than that of the substrate 100 while the thickness of the active layer 112 is smaller than those of the n-type AlGaN cladding layer 111 and the p-type AlGaN cladding layer 113, and hence warping occurs such that the substrate 100 side of the semiconductor laser diode element 50 is convex. In a case where the substrate 100 is made of silicon or silicon carbide, on the other hand, warping occurs such that the substrate 100 side of the semiconductor laser diode element 50 is convex (semiconductor laser diode portion 110 side is concave) resulting from the thermal expansion coefficients of the n-type AlGaN cladding layer 111, the active layer 112 and the p-type AlGaN cladding layer 113 constituting the semiconductor laser diode portion 110 larger than that of the substrate 100. The warping in the direction B of the semiconductor laser diode element 50 is larger than warping occurring in a direction C (see FIG. 5) of the semiconductor laser diode element 50.

According to the first embodiment, a distance (thickness of the conductive adhesive layer 60) H3 between the semiconductor laser diode element 50 and the base 70 in the vicinity of the light-emitting surface 110a of the cavity of the semiconductor laser diode element 50 is smaller than a distance (thickness of the conductive adhesive layer 60) H4 between the semiconductor laser diode element 50 and the base 70 in the vicinity of the light reflective surface 110b of the cavity of the semiconductor laser diode element 50, as shown in FIG. 3. According to the first embodiment, the semiconductor laser diode element 50 is fixed on the base 70 such that the conductive adhesive layer 60 in the vicinity of the light-emitting surface 110a has a thickness (distant H3) of about 1 μm when the conductive adhesive layer 60 in the vicinity of the light reflective surface 110b has a thickness (distance H4) of about 4 μm to about 8 μm.

The side closer to the light-emitting surface 110a of the semiconductor laser diode element 50 is so arranged as to be substantially parallel to the upper surface 70a of the base 70. In other words, the semiconductor laser diode element 50 is arranged such that the emission direction of the laser beam emitted from the light-emitting surface 110a is substantially parallel to a direction in which the upper surface 70a of the base 70 extends.

The conductive adhesive layer 60 has the same width (W1=about 200 μm) and length (L1=about 1000 μm) as those of the semiconductor laser diode element 50 (see FIG. 5).

The base 70 has a width (W2) of about 900 μm, a length (L2) of about 1200 μm and a thickness (t2) of about 250 μm (see FIG. 3), as shown in FIG. 4.

The base 70 includes a substrate 70b made of SiC or AlN as shown in FIG. 3. Metal underlayers 70c each formed by Ti layer having a thickness of about 100 nm, a Pt layer having a thickness of about 20 nm and an AU layer having a thickness of about 30 nm are formed on the overall upper and lower surfaces of the substrate 70b. The metal underlayers 70c are each provided for bonding the conductive adhesive layer 60 to the base 70.

A process of fabricating the semiconductor laser diode apparatus according to the first embodiment and the semiconductor laser comprising the same will be now described with reference to FIGS. 2, 3 and 5.

As shown in FIG. 5, the n-type AlGaN cladding layer 111, the active layer 112 made of GaInN and the p-type AlGaN cladding layer 113 are epitaxially grown on the upper surface of the substrate 100, thereby forming the semiconductor laser diode portion 110. Then the ridge portion 113a extending in the direction B is formed on the p-type AlGaN cladding layer 113 and the insulating film 114 made of SiO$_2$ is formed on the upper surface of the p-type AlGaN cladding layer 113 except the ridge portion 113a. Thereafter the n-side electrode 101 in which an Al layer, a Pd layer and an Au layer are stacked in this order from one nearest to the substrate 100 is formed on the lower surface of the substrate 100, and the p-side electrode 115 in which a Pt layer, a Pd layer, a Ti layer, a Pd layer and an Au layer are stacked in this order from one nearest to the ridge portion 113a and the insulating film 114 is formed on the upper surfaces of the ridge portion 113a of the p-type AlGaN cladding layer 113 and the insulating film 114 The dielectric multilayer films (not shown) are formed on the light-emitting surface 110a and the light reflective surface 110b of the cavity of the semiconductor laser diode portion 110, thereby forming the semiconductor laser diode element 50. At this time, the warping occurs on the semiconductor laser diode element 50 such that the substrate 100 side is convex (semiconductor laser diode portion 110 side is concave) resulting from the difference in the thermal expansion coefficient between the substrate 100 and the semiconductor laser diode portion 110 and the difference in the lattice constant between the substrate 100 and the semiconductor laser diode portion 110, according to the first embodiment.

According to the first embodiment, the convex side (substrate 100 side) of the warping of the semiconductor laser diode element 50 is bonded onto the base 70 such that the distance H3 (about 1 μm) (thickness of the conductive adhesive layer 60) H3 between the semiconductor laser diode element 50 and the base 70 in the vicinity of the light-emitting surface 110a of the cavity of the semiconductor laser diode element 50 is smaller than the distance (thickness of the conductive adhesive layer 60) H4 (in the range of about 4 μm to about 8 μm) between the semiconductor laser diode element 50 and the base 70 in the vicinity of the light reflective surface 110b of the cavity of the semiconductor laser diode element 50, as shown in FIG. 3. At this time, the base 70 is simultaneously fixed on the pedestal portion 82 of the stem 80 (see FIG. 2).

More specifically, the conductive adhesive layer 61, the base 70 arranged with the conductive adhesive layer 60 on a prescribed region and the semiconductor laser diode element 50 are arranged on the pedestal portion 82 of the stem 80 made of a metal in this order under in a nitrogen atmosphere, as shown in FIG. 2.

According to the first embodiment, the stem 80 (see FIG. 2) is rendered at a high temperature and the vicinity of the light-emitting surface 110a of the semiconductor laser diode element 50 is pressed against the base 70 through the conductive adhesive layer 60 with a collet 120 made of ceramic, as shown in FIG. 3. The collet 120 is an example of the "pressing member" in the present invention. At this time, while the vicinity of the light-emitting surface 110a of the semiconductor laser diode element 50 is pressed with the collet 120, the liquid conductive adhesive layer 60 on a region pressed with the collet 120 (side closer to the light-emitting surface 110a of the semiconductor laser diode element 50) moves to a region not pressed with the collet 120 (side closer to the light reflective surface 110b of the semiconductor laser diode element 50) and penetrates between the semiconductor laser diode element 50 on the side closer to the light reflective surface 110b and the base 70. The collet 120 is provided with a hole 120a. The semiconductor laser diode element 50 can be absorbed by vacuumizing the inside of the hole 120a.

Thereafter the stem 80 is cooled and the conductive adhesive layers 60 and 61 are solified, whereby the semiconductor laser diode element 50 is fixed on the base 70 through the conductive adhesive layer 60 and the base 70 is fixed on the pedestal portion 82 of the stem 80 through the conductive adhesive layer 61, as shown in FIG. 2.

The upper surface of the semiconductor laser diode element 50 and the lead terminal 83 of the stem 80 are connected to each other through wire-bonding with the Au wire 90, and the upper surface 70a of the base 70 and the pedestal portion 82 of the stem 80 are connected to each other by wire-bonding with the Au wire 90. Finally, the cap (not shown) with the window through which the laser beam is transmitted is mounted on the body portion 81 of the stem 80.

According to the first embodiment, as hereinabove described the distance H3 (about 1 μm) between the semiconductor laser diode element 50 and the base 70 in the vicinity of the light-emitting surface 110a of the cavity of the semiconductor laser diode element 50 is smaller than the distance H4 between the semiconductor laser diode element 50 and the base 70 in the vicinity of the light reflective surface 110b of the cavity of the semiconductor laser diode element 50, whereby variation in the distance H3 between the semiconductor laser diode element 50 and the base 70 in the vicinity of the light-emitting surface 110a of the cavity of the semiconductor laser diode element 50 can be reduced as compared with a case where the distance H3 between the semiconductor laser diode element 50 and the base 70 in the vicinity of the light-emitting surface 110a of the cavity of the semiconductor laser diode element 50 is larger. Thus, variation in the emission direction of the laser beam emitted from the light-emitting surface 110a of the cavity of the semiconductor laser diode element 50 can be suppressed. The convex side (substrate 100 side) of the warping of the semiconductor laser diode element 50 is fixed on the base 70 and the distance H3 between the semiconductor laser diode element 50 and the base 70 in the vicinity of the light-emitting surface 110a of the cavity of the semiconductor laser diode element 50 is smaller than the distance H4 between the semiconductor laser diode element 50 and the base 70 in the vicinity of the light reflective surface 110b of the cavity of the semiconductor laser diode element 50 whereby the side closer to the light-emitting surface 110a of the cavity of the semiconductor laser diode element 50 can be so arranged as to be substantially parallel to the upper surface 70a of the base 70 and hence the semiconductor laser diode element 50 can be inhibited from being arranged in a state where the emission direction of the laser beam emitted from the light-emitting surface 110a of the cavity of the semiconductor laser diode element 50 is inclined upward with respect to the upper surface 70a of the base 70. Thus, variation in the emission direction of the laser beam emitted from the light-emitting surface 110a of the cavity of the semiconductor laser diode element 50 can be suppressed. Thus, variation in the emission position and the emission direction of the laser beam emitted from the semiconductor laser diode element 50 can be suppressed and hence assembly yield of the semiconductor laser diode apparatus 40 can be improved. The semiconductor laser diode element 50 having the warping along the direction in which the cavity extends (direction B) is fixed on the base 70, whereby increase in stress in the semiconductor laser diode element 50 can be suppressed dissimilarly to a case where the semiconductor laser diode element 50 with no warping is fixed on the base 70 and hence deterioration of laser characteristics and breakage of the semi-conductor laser diode element 50 can be suppressed.

According to the first embodiment, the warping in the direction B of the semiconductor laser diode element 50 is larger than the warping in the direction C of the semiconductor laser diode element 50, and hence an emission direction (position of the light-emitting surface 110a) of a laser beam of the semiconductor laser diode element 50 can be easily distinguished by measuring the thickness of the conductive adhesive layer 60 after bonding the semiconductor laser diode element 50 to the base 70.

According to the first embodiment, the substrate 100 side of the semiconductor laser diode element 50 is fixed on the base 70 through the conductive adhesive layer 60, whereby variation in the emission position and the emission direction of the laser beam emitted from the semiconductor laser diode element 50 can be suppressed also in a case where the semiconductor laser diode element 50 includes the semiconductor laser diode portion 110 with the concave surface on the side farther from the substrate 100.

According to the first embodiment, the vicinity of the light-emitting surface 110a of the semiconductor laser diode element 50 is fixed on the base 70 through the conductive adhesive layer 60 while pressing the vicinity of the light-emitting surface 110a against the base 70 with the collet 120, whereby the distance H3 between the semiconductor laser diode element 50 and the base 70 in the vicinity of the light-emitting surface 110a of the cavity of the semiconductor laser diode element 50 can be smaller than the distance H4 between the semiconductor laser diode element 50 and the base 70 in the vicinity of the light reflective surface 110b of the cavity of the semiconductor laser diode element 50.

According to the first embodiment, the conductive adhesive layer 60 made of conductive AuSn is employed as the fusion layer, whereby the semiconductor laser diode element 50 and the metal underlayer 70c formed on the upper surface 70a of the base 70 can be easily rendered conductive. Thus, the upper surface 70a of the base 70 to which the semiconductor laser diode element 50 is not bonded can be effectively utilized as a region for wire-bonding.

Second Embodiment

Figure 6:
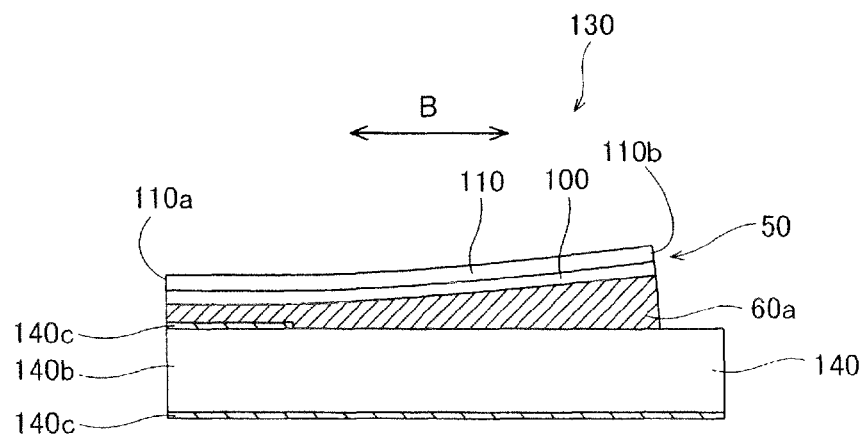
FIG. 6 is a sectional view for illustrating a structure of a semiconductor laser diode apparatus according to a second embodiment of the present invention.
Figure 7:
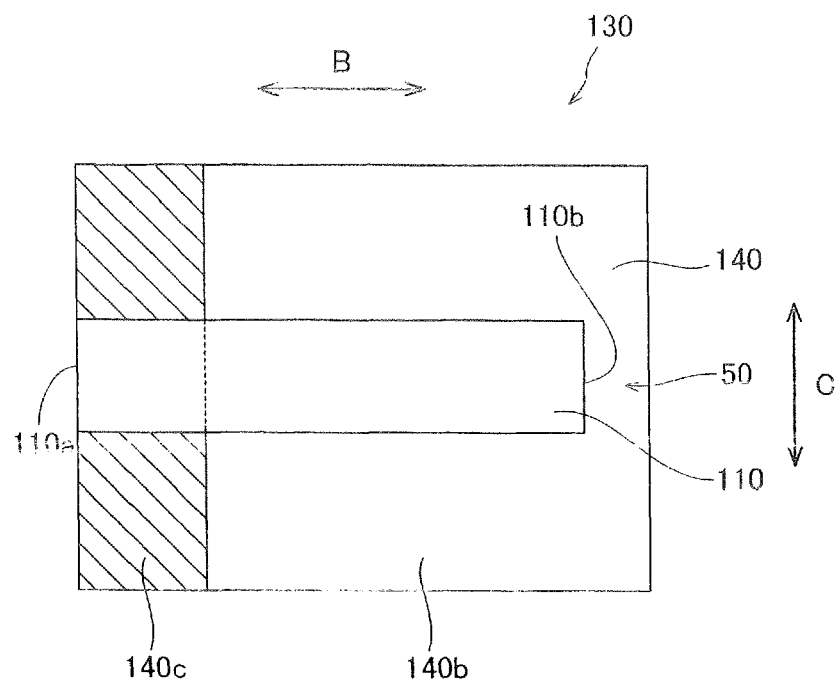
FIG. 7 is a plan view for illustrating the structure of the semiconductor laser diode apparatus according to the second embodiment of the present invention.
Figure 8:
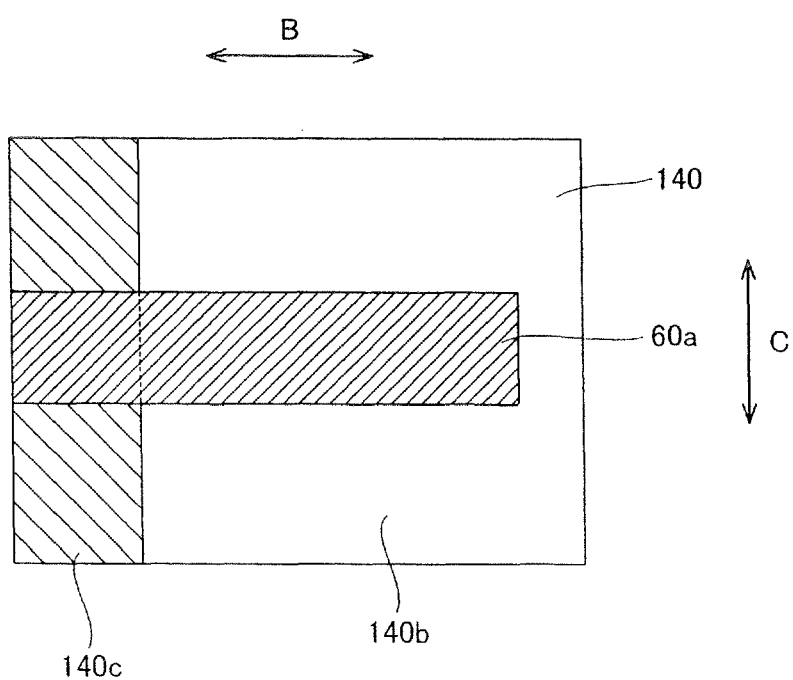
FIG. 8 is a plan view for illustrating a structure of a base of the semiconductor laser diode apparatus according to the second embodiment of the present invention shown in FIG. 6.

Referring to FIGS. 6 to 8, in a second embodiment only a side closer to a light-emitting surface 110a of a cavity of a semiconductor laser diode element 50 is fixed on a base 140 dissimilarly to the aforementioned first embodiment.

In a semiconductor laser diode apparatus 130 according to the second embodiment, the semiconductor laser diode element 50 is fixed on the base 140 through a conductive adhesive layer 60a (see FIG. 6) of AuSn as shown in FIGS. 6 and 7, similarly to the aforementioned first embodiment. The base 140 includes a substrate 140b made of SiC or AlN. The conductive adhesive layer 60a is an example of the "fusion layer" in the present invention.

According to the second embodiment, metal underlayers 140c each having a multilayer structure similar to that of the aforementioned first embodiment are formed on a region in the vicinity of the light-emitting surface 110a of the cavity of the semiconductor laser diode element 50 on an upper surface of the substrate 140b and an overall lower surface of the substrate 140b. In other words, according to the second embodiment, the metal underlayer 140c on the upper surface of the substrate 140b is formed in the vicinity of the light-emitting surface 110a (see FIG. 6) of the cavity of the semiconductor laser diode element 50, while no metal under layer 140c is formed on a region closer to a light reflective surface 110b (see FIG. 6) of the cavity of the semiconductor laser diode element 50. The conductive adhesive layer 60a made of AuSn is hardly bonded to the substrate 140b made of SiC or AlN, and hence a side closer to the light reflective surface 110b of the cavity of the semiconductor laser diode element 50 is not fixed on the base 140 and only the vicinity of the light-emitting surface 110a of the cavity of the semiconductor laser diode element 50 is fixed on the base 140 through the conductive adhesive layer 60a.

The remaining structure of the semiconductor laser diode apparatus 130 according to the second embodiment is similar to that of the aforementioned first embodiment.

A process of fabricating the semiconductor laser diode apparatus 130 according to the second embodiment will be now described with reference to FIGS. 6 to 8.

First, the semiconductor laser diode element 50 is formed through a fabricating process similar to that of the aforementioned first embodiment.

According to the second embodiment, the base 140 formed with the metal underlayers 140c on the region in the vicinity of the light-emitting surface 110a of the cavity of the semiconductor laser diode element 50 on the upper surface of the substrate 140b and the overall lower surface of the substrate 140b is prepared, as shown in FIGS. 6 and 8.

As shown in FIGS. 6 and 7, a convex side (substrate 100 side) of warping of the semiconductor laser diode element 50 is bonded onto the base 140 through a fabricating process similar to that of the aforementioned first embodiment.

The remaining fabricating process of the second embodiment is similar to that of the aforementioned first embodiment.

According to the second embodiment, as hereinabove described, the side closer to the light reflective surface 110b of the cavity of the semiconductor laser diode element 50 is not fixed on the base 140 and only the vicinity of the light-emitting surface 110a of the cavity of the semiconductor laser diode element 50 is fixed on the base 140 through the conductive adhesive layer 60a, whereby increase in stress in the semiconductor laser diode element 50 due to thermal shrinkage in hardening of the conductive adhesive layer 60a can be suppressed dissimilarly to a case where the light-emitting surface 110a to the light reflective surface 110b of the cavity of the semiconductor laser diode element 50 is entirely fixed to the base 140, and hence deterioration of laser characteristics and breakage of the semiconductor laser diode element 50 can be suppressed.

The remaining effects of the second embodiment are similar to those of the aforementioned first embodiment.

Third Embodiment

Figure 9:
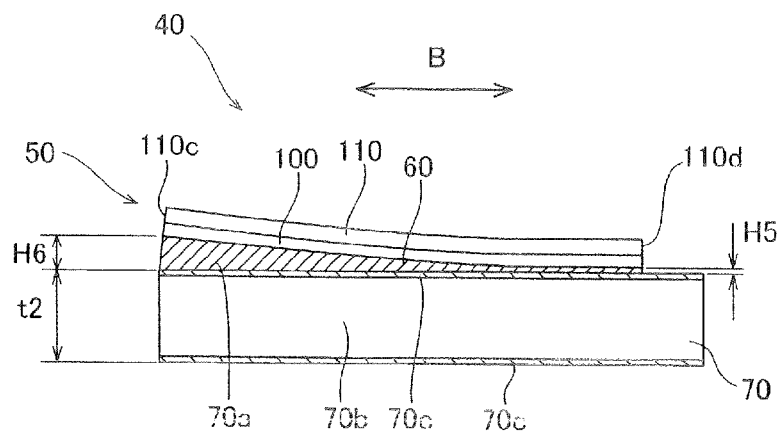
FIG. 9 is a sectional view for illustrating a structure of a semiconductor laser diode apparatus according to a third embodiment of the present invention.

Referring to FIG. 9, in a third embodiment, a distance between a semiconductor laser diode element 50 and a base 70 in the vicinity of a light reflective surface 110d is smaller than a distance between the semiconductor laser diode element 50 and the base 70 in the vicinity of a light-emitting surface 110c dissimilarly to the aforementioned first embodiment. The light-emitting surface 110c is an example of the "second end" in the present invention, and the light reflective surface 110d is an example of the "first end" in the present invention.

According to the third embodiment, the distance H5 (thickness of the conductive adhesive layer 60) between the semiconductor laser diode element 50 and the base 70 in the vicinity of the light reflective surface 110d of a cavity of the semiconductor laser diode element 50 is smaller than the distance H6 (thickness of the conductive adhesive layer 60) between the semiconductor laser diode element 50 and the base 70 in the vicinity of the light-emitting surface 110c of the cavity of the semiconductor laser diode element 50 as shown in FIG. 9. In other words, in the semiconductor laser diode element 50 according to the third embodiment, the conductive adhesive layer 60 is fixed on the base 70 so as to have a thickness (distance H6) of about 4 μm to about 8 μm in the vicinity of the light-emitting surface 110c and a thickness of substantially 0 μm in the vicinity of the light reflective surface 110d.

The remaining structure and fabricating process of the semiconductor laser diode apparatus 40 according to the third embodiment will is similar to that of the aforementioned first embodiment.

According to the third embodiment, as hereinabove described, the distance H5 (about 1 μm) between the semiconductor laser diode element 50 and the base 70 in the vicinity of the light reflective surface 110d of the cavity of the semiconductor laser diode element 50 is smaller than the distance H6 (in the range of about 4 μm to about 8 μm) between the semiconductor laser diode element 50 and the base 70 in the vicinity of the light-emitting surface 110c of the cavity of the semiconductor laser diode element 50, whereby the semiconductor laser diode element 50 is bonded to the base 70 such that the thickness of the conductive adhesive layer 60 is changed along a cavity direction of the semiconductor laser diode element 50 (direction B). Thus, an emission direction (position of the light-emitting surface 110c) of a laser beam of the semiconductor laser diode element 50 can be easily distinguished by measuring the thickness of the conductive adhesive layer 60 after bonding. The remaining effects of the third embodiment are similar to those of the aforementioned first embodiment.

Fourth Embodiment

Figure 10:
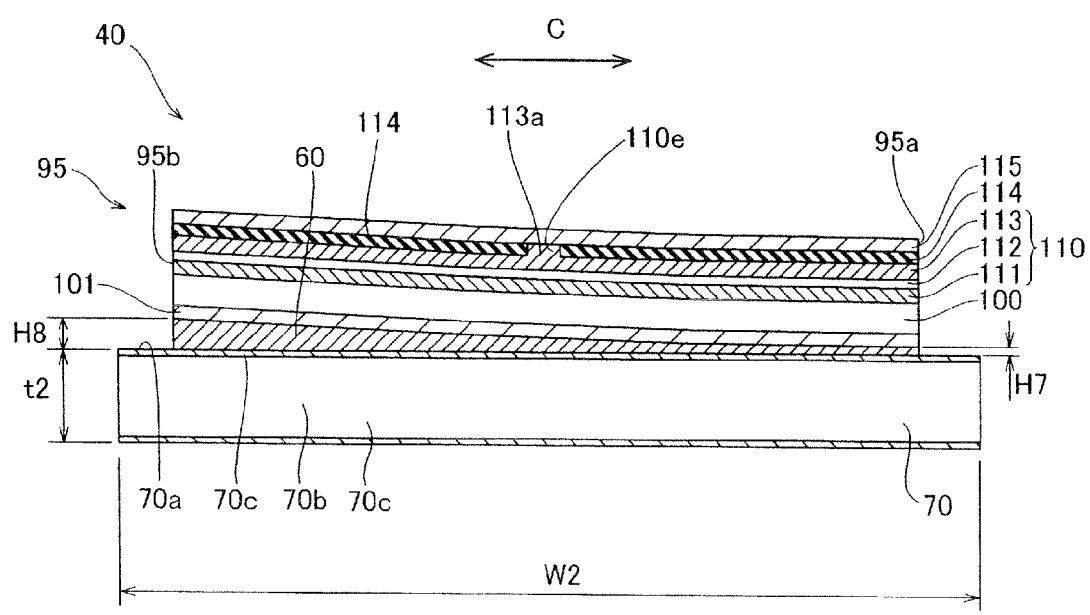
FIG. 10 is a sectional view for illustrating a structure of a semiconductor laser diode apparatus according to a fourth embodiment of the present invention.
Figure 11:
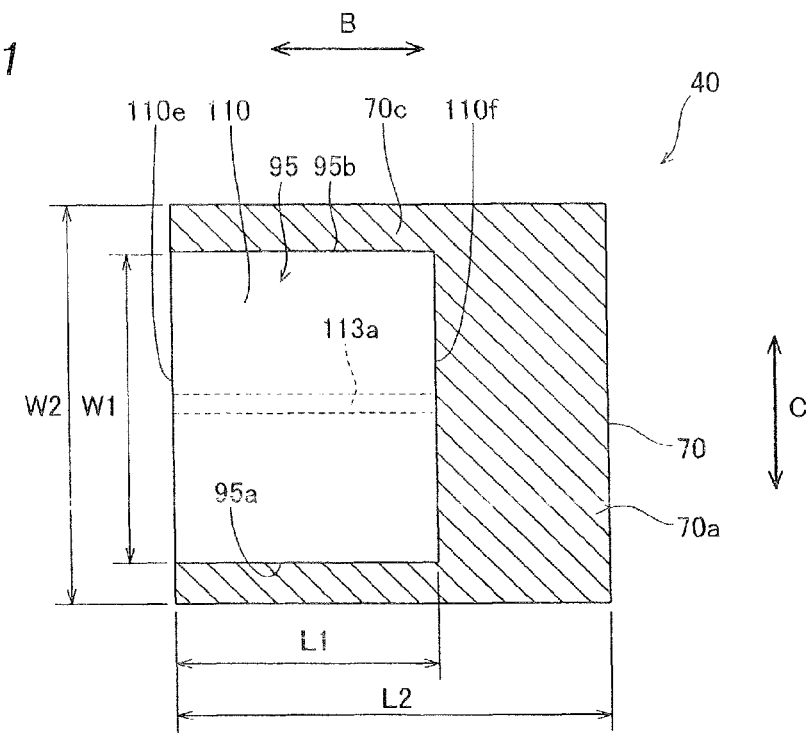
FIG. 11 is a plan view for illustrating the structure of the semiconductor laser diode apparatus according to the fourth embodiment of the present invention shown in FIG. 10.

Referring to FIGS. 10 and 11, in a fourth embodiment a semiconductor laser diode element 95 having warping in an element width direction (direction perpendicular to a direction in which a cavity extends) is fixed on a base 70 dissimilarly to the aforementioned first embodiment.

In a semiconductor laser comprising a semiconductor laser diode apparatus 40 according to the fourth embodiment, the semiconductor laser diode element 95 is fixed on the base 70 through a conductive adhesive layer 60 of AuSn as shown in FIGS. 10 and 11. The semiconductor laser diode element 95 has a width (W1) of about 800 μm, a length (L1) of about 700 μm and a thickness (t1) of about 100 μm. The base 70 has a width (W2) of about 900 μm, a length (L2) of about 1200 μm and a thickness (t2) of about 250 μm.

According to the fourth embodiment, the semiconductor laser diode element 95 has warping of about 0.5 μm to about 3 μm along a direction (direction C) perpendicular to a direction in which the cavity extends (direction B), as shown in FIG. 10. In the semiconductor laser diode portion 110, a surface on a side farther from the substrate 100 is concave, and the semiconductor laser diode element 95 has a convex side (substrate 100 side) of the warping fixed on the base 70. The warping in the direction C of the semiconductor laser diode element 95 is larger than the warping occurring in the direction B of the semiconductor laser diode element 95.

According to the fourth embodiment, a distance (thickness of the conductive adhesive layer 60) H7 between the semiconductor laser diode element 95 and the base 70 in the vicinity of a first end 95a in the direction (direction C) along a cavity facet (light-emitting surface 110e or light reflective surface 110f) of the semiconductor laser diode element 95 is smaller than a distance (thickness of the conductive adhesive layer 60) H8 between the semiconductor laser diode element 95 and the base 70 in the vicinity of a second end 95b in the direction C of the semiconductor laser diode element 95, as shown in FIG. 10. According to the fourth embodiment, when the conductive adhesive layer 60 has a thickness (distance H8) of about 4 μm to about 8 μm in the vicinity of the second end 95b, the semiconductor laser diode element 95 is fixed on the base 70 so as to have a thickness of about 1 μm in the vicinity of the first end 95a.

The remaining structure and fabricating process of the semiconductor laser diode apparatus 40 according to the fourth embodiment is similar to that of the aforementioned first embodiment.

According to the fourth embodiment, as hereinabove described, the distance H7 (about 1 μm) between the semiconductor laser diode element 95 and the base 70 in the vicinity of the first end 95a in the direction C of the semiconductor laser diode element 95 is smaller than the distance H8 (in the range of about 4 μm to about 8 μm) between the semiconductor laser diode element 95 and the base 70 in the vicinity of the second end 95b in the direction C of the semiconductor laser diode element 95, whereby the semiconductor laser diode element 95 is bonded to the base 70 such that the thickness of the conductive adhesive layer 60 is changed along the width direction (direction C) of the semiconductor laser diode element 95. Thus, an emission direction (position of the light-emitting surface 110e) of a laser beam of the semiconductor laser diode element 95 can be easily distinguished by measuring the thickness of the conductive adhesive layer 60 after bonding.

Fifth Embodiment

Figure 12:
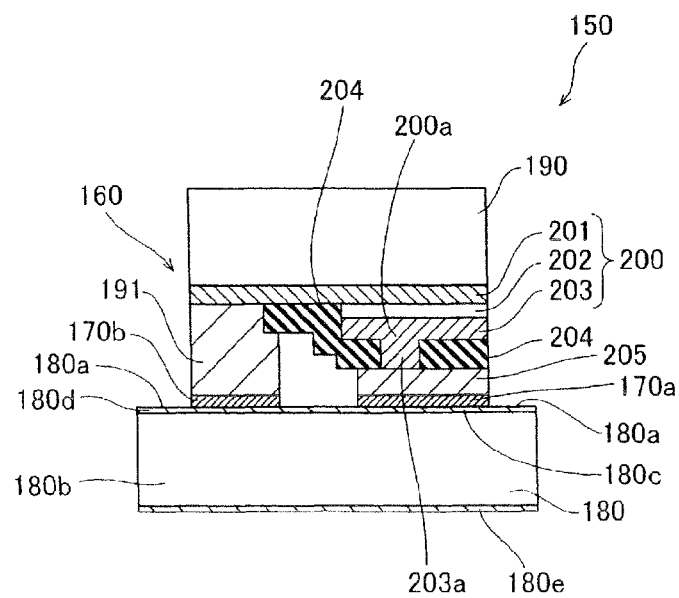
FIG. 12 is a front elevational view for illustrating a structure of a semiconductor laser diode apparatus according to a fifth embodiment of the present invention.
Figure 13:
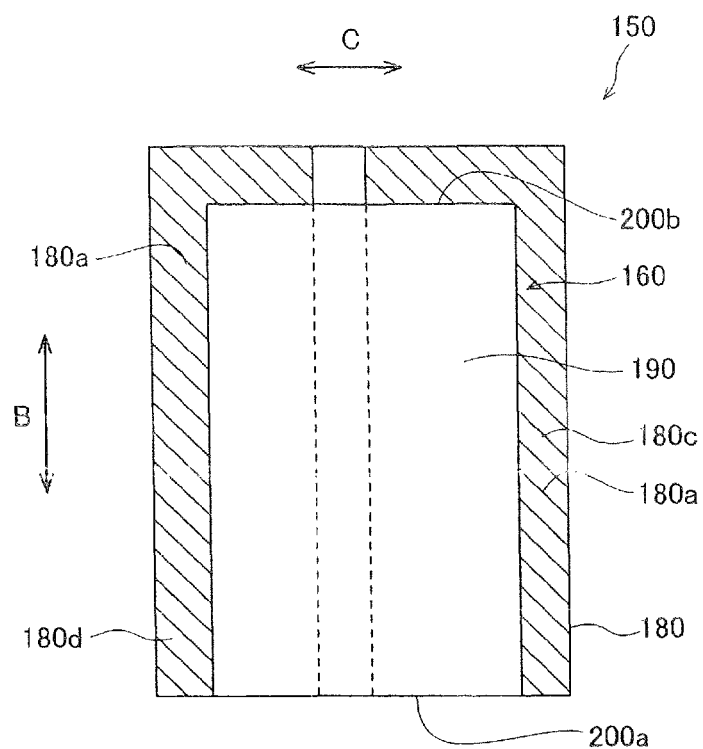
FIG. 13 is a plan view for illustrating the structure of the semiconductor laser diode apparatus according to the fifth embodiment of the present invention shown in FIG. 12.
Figure 14:
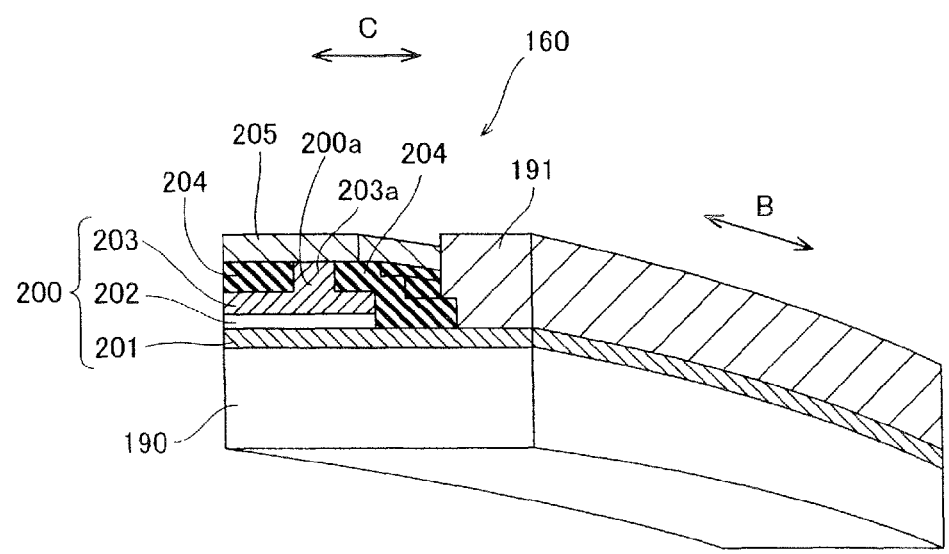
FIG. 14 is a perspective view for illustrating the structure of a semiconductor laser diode element of the semiconductor laser diode apparatus according to the fifth embodiment of the present invention shown in FIG. 12.

Referring to FIGS. 12 to 14, in a fifth embodiment, a semiconductor laser diode element 160 has warping such that a substrate 190 side of the semiconductor laser diode element 160 is concave (semiconductor laser diode portion 200 side is convex) dissimilarly to the aforementioned first to fourth embodiments.

In a semiconductor laser diode apparatus 150 according to the fifth embodiment, the semiconductor laser diode element 160 is fixed on a base 180 through conductive adhesive layers 170a and 170b (see FIG. 12) of AuSn, as shown in FIGS. 12 and 13. The conductive adhesive layers 170a and 170b are each an example of the "fusion layer" in the present invention.

According to the fifth embodiment, the semiconductor laser diode element 160 includes the semiconductor laser diode portion 200 arranged on a side closer to the base 180 and the substrate 190 arranged on a side farther from the base 180 as shown in FIG. 12. The substrate 190 is an example of the "substrate" in the present invention.

More specifically, an n-type AlGaN cladding layer 201 is formed on an upper surface of the substrate 190 made of sapphire, as shown in FIG. 14. An active layer 202 made of GaInN and a p-type AlGaN cladding layer 203 are formed on a region on a first side of an upper surface of the n-type AlGaN cladding layer 201. The n-type AlGaN cladding layer 201, the active layer 202 and the p-type AlGaN cladding layer 203 form the semiconductor laser diode portion 200. The n-type AlGaN cladding layer 201, the active layer 202 and the p-type AlGaN cladding layer 203 are each an example of the "nitride-based semiconductor layer" in the present invention. In the p-type AlGaN cladding layer 203, a waveguide structure is formed by forming a ridge portion 203a extending in a direction B. A light-emitting surface (cavity facet) 200a and a light reflective surface (cavity facet) 200b (see FIG. 13) are formed on ends in the direction B of the semiconductor laser diode portion 200. The light-emitting surface 200a, the light reflective surface 200b and the waveguide structure constitute a cavity extending in the direction B. The light-emitting surface 200a is an example of the "first end" or the "light-emitting end" in the present invention, and the light reflective surface 200b is an example of the "second end" or the "light reflective end" in the present invention. Insulating films 204 made of $SiO_2$ are formed on a prescribed region of the upper surface of the n-type AlGaN cladding layer 201 and the upper surface of the p-type AlGaN cladding layer 203 except the ridge portion 203a.

An n-side electrode 191 in which an Al layer, a Pd layer and an Au layer are stacked in this order from one nearest to the n-type AlGaN cladding layer 201 is formed on a region on a second side of the upper surface of the n-type AlGaN cladding layer 201. A p-side electrode 205 in which a Pt layer, a Pd layer, a Ti layer, a Pd layer and an Au layer are stacked in this order from one nearest to the ridge portion 203a and the insulating film 204 is formed on a prescribed region of upper surfaces of the ridge portion 203a of the p-type AlGaN cladding layer 203 and the insulating film 204. According to the fifth embodiment, upper surfaces of the n-side electrode 191 and the p-side electrode 205 are bonding surfaces.

According to the fifth embodiment, the semiconductor laser diode element 160 has the warping of about 1 μm to about 3 μm along in the direction (direction B) in which the cavity extends (direction B) as shown in FIG. 14, although it varies with the kinds or quantities of addition elements of heterojunction. In the semiconductor laser diode portion 200, a surface on a side farther from the substrate 190 is convex, and the semiconductor laser diode element 160 has the convex side (semiconductor laser diode portion 200 side) of the warping fixed on the base 180 (see FIG. 12). The warping of the semiconductor laser diode element 160 occurs due to difference in thermal expansion coefficient between the substrate 190 and the semiconductor laser diode portion 200 and difference in lattice constant between the substrate 190 and the semiconductor laser diode portion 200.

More specifically, sapphire has a thermal expansion coefficient in the a-axis direction of about $7.5 \times 10^{-6}$/K and a lattice constant in the a-axis direction of about $4.4759 \times 10^{-10}$ m, as shown in the following Table 2. AlGaN has a thermal expansion coefficient in the a-axis direction of about $4.15\times10^{-6}$/K to about $5.59\times10^{-6}$/K and a lattice constant in the a-axis direction of about $3.112\times10^{-10}$ m to about $3.189\times10^{-10}$, as shown in the aforementioned Table 1. GaInN has a thermal expansion coefficient in the a-axis direction of about $3.8\times10^{-6}$/K to about $5.59\times10^{-6}$/K and a lattice constant in the a-axis direction of about $3.189\times10^{-10}$ m to about $3.533\times10^{-10}$ m.

TABLE 2

| Material | Thermal Expansion Coefficient ($10^{-6}$/K) in a-Axis Direction | Lattice Constant ($10^{-10}$ m) in a-Axis Direction | Warping of Element Forming Surface |
|---|---|---|---|
| $Al_2O_3$ (Sapphire Substrate) | 7.5 | 4.4759 | Convex |

In a case where the substrate 190 is made of sapphire, warping occurs such that the substrate 190 side of the semiconductor laser diode element 160 is concave (semiconductor laser diode portion 200 side is convex) resulting from the thermal expansion coefficients of the n-type AlGaN cladding layer 201, the active layer 202 and the p-type AlGaN cladding layer 203 constituting the semiconductor laser diode portion 200 smaller than that of the substrate 190. In a case where an n-type GaInN cladding layer, an active layer made of GaInN and a p-type GaInN cladding layer is formed on a substrate made of gallium nitride, warping occurs such that the substrate side of the semiconductor laser diode element is concave (semiconductor laser diode portion side is convex) resulting from the lattice constant (about $3.189\times10^{-10}$ m to about $3.533\times10^{-10}$ m) of GaInN constituting the semiconductor laser diode portion larger than the lattice constant (about $3.189\times10^{-10}$ m) (see Table 1) of gallium nitride. The warping in the direction B of the semiconductor laser diode element 160 is larger than the warping occurring in the direction C of the semiconductor laser diode element 160.

The side closer to the light-emitting surface 200a of the semiconductor laser diode element 160 is so arranged as to be substantially parallel to the upper surface 180a of the base 180 similarly to the aforementioned first and second embodiments.

As shown in FIG. 12, the base 180 includes a substrate 180b made of SiC or AlN similarly to the aforementioned first and second embodiments.

According to the fifth embodiment, metal underlayers 180c and 180d each having a multilayer structure similar to those of the aforementioned first and second embodiments are formed on a first side of the upper surface of the substrate 180b and a second side spaced from the first side by a prescribed distance respectively A metal underlayer 180e having a multilayer structure similar to those of the aforementioned first and second embodiments is formed on an overall lower surface of the substrate 180b.

According to the fifth embodiment, the conductive adhesive layers 170a and 170b are arranged with a prescribed interval therebetween. The conductive adhesive layer 170a is arranged between the metal underlayer 180c and the p-side electrode 205, while the conductive adhesive layer 170b is arranged between the metal underlayer 180d and the n-side electrode 191.

The remaining structure of the semiconductor laser diode apparatus 150 according to the fifth embodiment is similar to that of the aforementioned first embodiment.

A process of fabricating the semiconductor laser diode apparatus 150 according to the fifth embodiment will be now described with reference to FIGS. 12 to 14.

As shown in FIG. 14, the n-type AlGaN cladding layer 201 is formed on the upper surface of the substrate 190. The active layer 202 made of GaInN and the p-type AlGaN cladding layer 203 are epitaxially grown on the region on the first side of the upper surface of the n-type AlGaN cladding layer 201, thereby forming the semiconductor laser diode portion 200. The ridge portion 203a extending in the direction B is formed on the p-type AlGaN cladding layer 203. The insulating film 204 made of $SiO_2$ is formed on the prescribed region of the upper surface of the n-type AlGaN cladding layer 201 and the upper surface of the p-type AlGaN cladding layer 203 except the ridge portion 203a. Thereafter the n-side electrode 191 in which an Al layer, a Pd layer and an Au layer are stacked in this order from one nearest to the n-type AlGaN cladding layer 201 is formed on the region on the second side of the upper surface of the n-type AlGaN cladding layer 201, and the p-side electrode 205 in which a Pt layer, a Pd layer, a Ti layer, a Pd layer and an Au layer are stacked in this order from one nearest to the ridge portion 203a and the insulating film 204 is formed on the prescribed region of the upper surfaces of the ridge portion 203a of the p-type AlGaN cladding layer 203 and the insulating film 204. At this time, the warping occurs on the semiconductor laser diode element 160 such that the substrate 190 side is concave (semiconductor laser diode portion 200 side is convex) resulting from the difference in the thermal expansion coefficient between the substrate 190 and the semiconductor laser diode portion 200 and the difference in the lattice constant between the substrate 190 and the semiconductor laser diode portion 200, according to the fifth embodiment.

As shown in FIGS. 12 and 13, the base 180 formed with the metal underlayers 180c and 180d on the first and second sides of the upper surface of the substrate 180b respectively and the metal underlayer 180e on the overall lower surface of the substrate 180b is prepared.

According to the fifth embodiment, the convex side (semiconductor laser diode portion 200 side) of the warping of the semiconductor laser diode element 160 is bonded to the base 180 through the conductive adhesive layers 170a and 170b (see FIG. 12). At this time, the p-side electrode 205 is fixed on the metal underlayer 180c through the conductive adhesive layer 170a and the n-side electrode 191 is fixed on the metal underlayer 180d through the conductive adhesive layer 170b.

The remaining fabricating process of the fifth embodiment is similar to that of the aforementioned first embodiment.

According to the fifth embodiment, the semiconductor laser diode portion 200 side of the semiconductor laser diode element 160 is fixed on the base 180 through the conductive adhesive layers 170a and 170b, whereby variation in the emission position and the emission direction of the laser beam emitted from the semiconductor laser diode element 160 can be easily suppressed also in a case where the semiconductor laser diode element 160 includes the semiconductor laser diode portion 200 with the concave surface on the side farther from the substrate The remaining effects of the fifth embodiment are similar to those of the aforementioned first embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the semiconductor laser diode element is pressed against the base with the collet when the semiconductor laser diode element is fixed on the base in each of the aforementioned first to fifth embodiments, the present invention is not restricted to this but the semiconductor laser diode element may be pressed against the base with a member other than the collet when the semiconductor laser diode element is fixed on the base.

While the semiconductor laser diode portion is formed by the nitride-based semiconductor layer in each of the aforementioned first to fifth embodiments, the present invention is not restricted to this but the semiconductor laser diode element portion may be formed by a layer other than the nitride-based semiconductor layer.

While the side closer to the light-emitting surface of the semiconductor laser diode element is so arranged as to be substantially parallel to the upper surface of the base in each of the aforementioned first to fifth embodiments, the present invention is not restricted to this but the side closer to the light-emitting surface of the semiconductor laser diode element may be so arranged as to be substantially parallel to the upper surface of the base.

While the convex side (semiconductor laser diode portion 200 side) of the warping of the semiconductor laser diode element 160 is fixed on the base 180 over the entire region in the direction where the cavity extends (direction B) in the aforementioned fifth embodiment, the present invention is not restricted to this but only the vicinity of the prescribed region on the side closer to the light-emitting surface 200a of the cavity of the semiconductor laser diode element 160 may be fixed on the base 180 through the conductive adhesive layers 170a and 170b through a method of fixing the semiconductor laser diode portion and the base similar to that of the aforementioned second embodiment.

What is claimed is:

1. A semiconductor laser diode apparatus comprising:
a semiconductor laser diode element having warping along at least either a first direction in which a cavity extends or a second direction intersecting with said first direction; and
a base on which a convex side of the warping of said semiconductor laser diode element is fixed through a fusion layer, wherein
a distance between said base and a first end of said semiconductor laser diode element in said first direction is smaller than a distance between said base and a second end of said semiconductor laser diode element in said first direction, and
said first end is a light-emitting end of said semiconductor laser diode element, and said second end is a light reflective end of said semiconductor laser diode element, and
a metal underlayer is formed between said base and said fusion layer, and the metal underlayer is formed on a region closer to said first end than said second end, and no metal underlayer is formed on a region closer to said second end than said first end.

2. The semiconductor laser diode apparatus according to claim 1, wherein
warping of said semiconductor laser diode element in said first direction is larger than warping of said semiconductor laser diode element in said second direction.

3. The semiconductor laser diode apparatus according to claim 1, wherein
said semiconductor laser diode element includes a substrate and a semiconductor laser diode portion formed on a surface of said substrate and having a concave surface on a side farther from said substrate, and said semiconductor laser diode element has a side of said substrate fixed on said base through a fusion layer.

4. The semiconductor laser diode apparatus according to claim 3, wherein
said fusion layer has conductivity.

5. The semiconductor laser diode apparatus according to claim 1, wherein
said semiconductor laser diode element includes a substrate and a semiconductor laser diode portion formed on a surface of said substrate and having a convex surface on a side farther from said substrate, and
said semiconductor laser diode element has a side of said semiconductor laser diode portion fixed on said base through said fusion layer.

6. The semiconductor laser diode apparatus according to claim 1, wherein
said semiconductor laser diode element includes a semiconductor laser diode portion having a nitride-based semiconductor layer.

7. The semiconductor laser diode apparatus according to claim 1, wherein
warping of said semiconductor laser diode element in said second direction is larger than warping of said semiconductor laser diode element in said first direction.

8. A semiconductor laser diode apparatus comprising:
a semiconductor laser diode element having warping along a second direction intersecting with a first direction, said first direction is a direction in which a cavity extends; and
a base, wherein
said semiconductor laser diode element has a convex surface and a concave surface opposite to said convex surface,
said convex surface is fixed on said base,
warping of said semiconductor laser diode element in said second direction is larger than warping of said semiconductor laser diode element in said first direction,
a distance between said base and a first end of said semiconductor laser diode element in said second direction is smaller than a distance between said base and a second end of said semiconductor laser diode element in said second direction.

9. The semiconductor laser diode apparatus according to claim 8, wherein
said semiconductor laser diode element includes a substrate and a semiconductor laser diode portion formed on a surface of said substrate and having a convex surface on a side farther from said substrate, and
said semiconductor laser diode element has a side of said semiconductor laser diode portion fixed on said base through a fusion layer.

10. The semiconductor laser diode apparatus according to claim 8, wherein
said semiconductor laser diode element includes a semiconductor laser diode portion having a nitride-based semiconductor layer.

11. The semiconductor laser diode apparatus according to claim 1, wherein
a vicinity of said light reflective end is not fixed on said base.

12. The semiconductor laser diode apparatus according to claim 1, wherein
said base includes a substrate made of SiC or AlN.

* * * * *